United States Patent [19]
Lee et al.

[11] Patent Number: 5,880,502
[45] Date of Patent: Mar. 9, 1999

[54] LOW AND HIGH VOLTAGE CMOS DEVICES AND PROCESS FOR FABRICATING SAME

[75] Inventors: John K. Lee, Meridian; Behnam Moradi; Michael J. Westphal, both of Boise, all of Id.

[73] Assignee: Micron Display Technology, Inc., Boise, Id.

[21] Appl. No.: 709,425

[22] Filed: Sep. 6, 1996

[51] Int. Cl.[6] .......................... H01L 29/76; H01L 29/94; H01L 31/062; H01L 31/113

[52] U.S. Cl. .................... 257/372; 257/369; 257/389; 257/396; 257/399; 257/400

[58] Field of Search .................... 257/369, 371, 257/372, 389, 396, 399, 400

[56] References Cited

U.S. PATENT DOCUMENTS

| | | |
|---|---|---|
| 4,442,591 | 4/1984 | Haken .......................................... 29/571 |
| 4,613,885 | 9/1986 | Haken ......................................... 357/42 |
| 4,613,886 | 9/1986 | Chwang . |
| 4,795,716 | 1/1989 | Yilmaz et al. . |
| 4,866,002 | 9/1989 | Shizukuishi et al. . |
| 4,879,583 | 11/1989 | Custode . |
| 5,047,358 | 9/1991 | Kosiak et al. ............................. 437/34 |
| 5,138,420 | 8/1992 | Komori et al. . |
| 5,376,568 | 12/1994 | Yang ......................................... 437/40 |
| 5,495,122 | 2/1996 | Tada ......................................... 257/392 |
| 5,497,021 | 3/1996 | Tada ......................................... 257/369 |
| 5,498,554 | 3/1996 | Mei ........................................... 437/34 |
| 5,501,994 | 3/1996 | Mei ........................................... 437/40 |

*Primary Examiner*—Ngân V. Ngô
*Attorney, Agent, or Firm*—Hale and Dorr LLP

[57] ABSTRACT

CMOS devices and process for fabricating low voltage, high voltage, or both low voltage and high voltage CMOS devices are disclosed. According to the process, p-channel stops and source/drain regions of PMOS devices are implanted into a substrate in a single step. Further, gates for both NMOS and PMOS devices are doped with n-type dopant and NMOS gates are self-aligned.

14 Claims, 8 Drawing Sheets

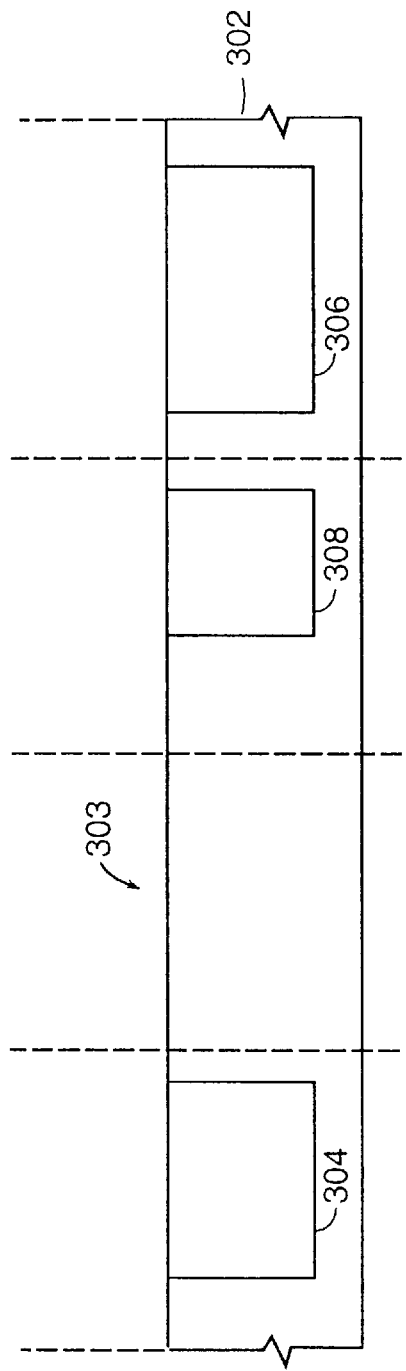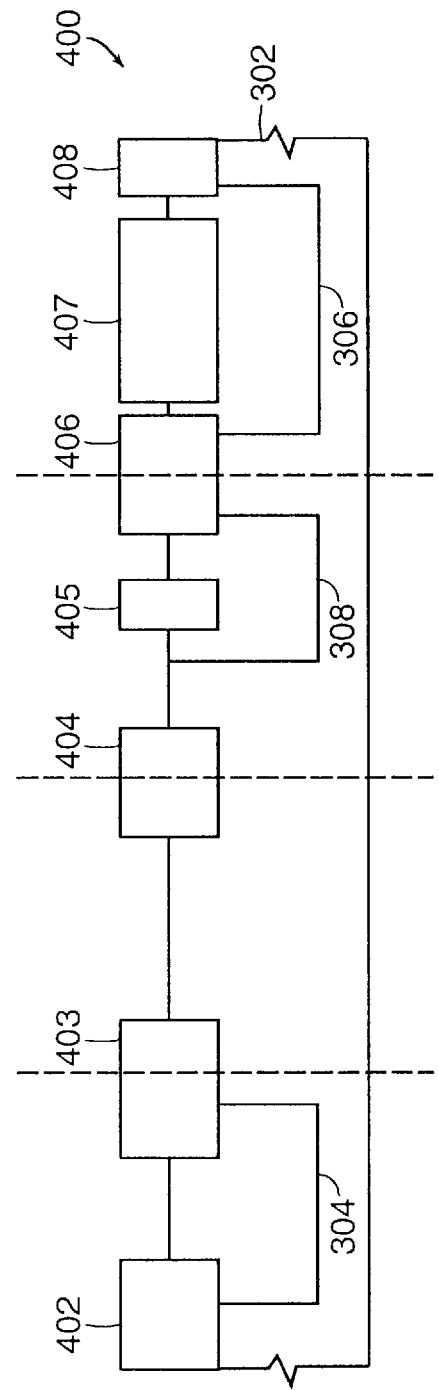

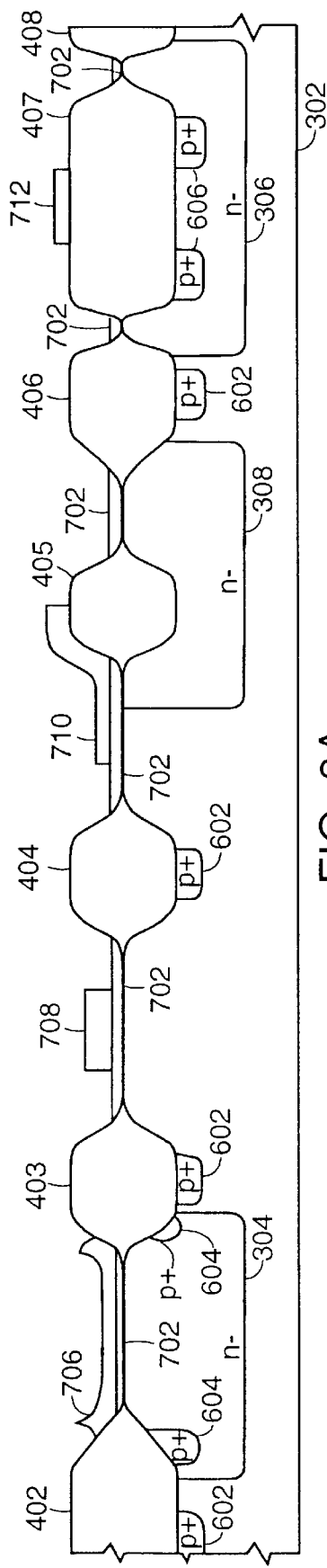
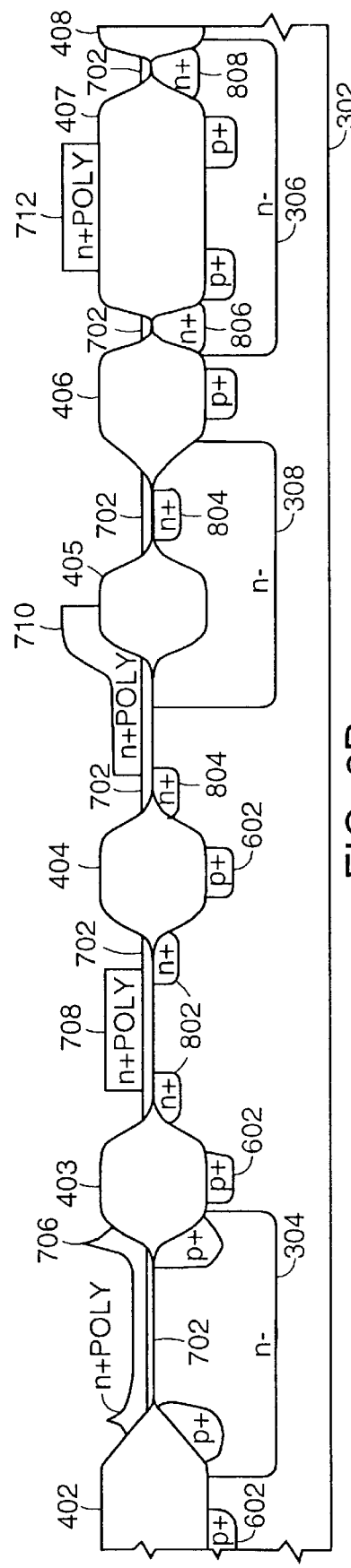
FIG. 8A
FIG. 8B

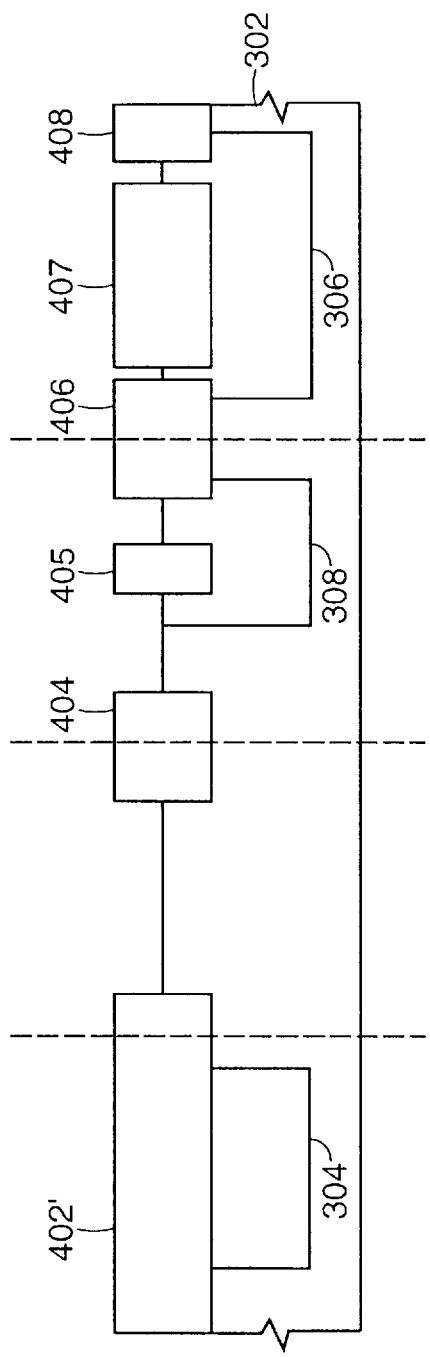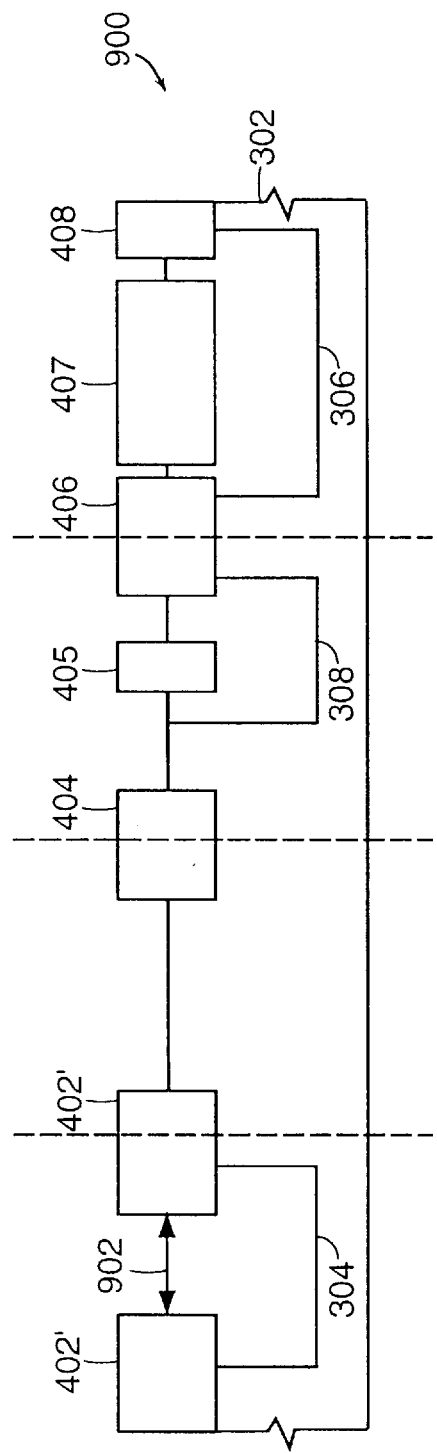

LOW AND HIGH VOLTAGE CMOS DEVICES AND PROCESS FOR FABRICATING SAME

This invention was made with Government support under Contract No. DABT63-93-C-0025 awarded by Advanced Research Projects Agency (ARPA). The Government has certain rights in this invention.

BACKGROUND OF THE INVENTION

This invention relates to complementary metal oxide semiconductor (CMOS) devices and, more particularly, to CMOS device architectures and processes for manufacturing low voltage, high voltage, or both low voltage and high voltage CMOS devices with a reduced number of processing steps.

Typically, CMOS manufacturing processes require more processing steps than manufacturing processes for standard n-channel metal oxide semiconductor (NMOS) devices. The advantage of reduced power consumption for the CMOS devices compared to NMOS devices is offset by increased manufacturing complexity, i.e., an increased number of manufacturing process steps. The complexity of conventional CMOS manufacturing processes is further increased when both low voltage and high voltage CMOS devices are within the same circuit.

Referring to FIG. 1, a typical low-voltage CMOS device 10 consists of an n-channel (NMOS) portion 12 and a p-channel (PMOS) portion 14 formed on a p-doped substrate 18. (The term substrate, as used herein, refers to one or more semiconductor layers or structures that include active or operable portions of semiconductor devices.) The process steps required to fabricate this device are well-known to those having ordinary skill in the art. For example, one of the first steps in a CMOS fabrication process is to implant and drive in n-well 16 into p-substrate 18. A subsequent step is to mask and implant p-channel stops 20 into substrate 18. Thereafter, thick field oxide 22 is grown over p-channel stops 20, and thin gate oxide 24, 26 is grown over the surface of substrate 18. Polysilicon layer 32, 34 is added atop the thin gate oxide 24, 26, respectively, to form gate structures of the NMOS 12 and PMOS 14 devices, respectively. Finally, in separate mask and implant steps, source/drain (S/D) regions 28 and 30 of the NMOS device 12 and PMOS device 14, respectively, are formed.

The foregoing list of CMOS fabrication steps is not intended to be comprehensive. It is well understood by those having ordinary skill in the art that additional steps are required to fabricate device 10, such as adjusting the threshold voltage ($V_t$) of the device through doping implantation and forming electrical contacts to substrate 18, n-well 16, S/D regions 28, 30 and gates 32, 34. Moreover, there are many equivalent and suitable known processes for forming such devices. The foregoing steps merely serve to illustrate that typical low-voltage CMOS fabrication requires two separate mask and implant steps to form p-channel stops and S/D regions for p-channel (i.e. PMOS) devices.

CMOS fabrication is further complicated by the combination of high-voltage and low-voltage CMOS devices in a single substrate. Specifically, adding a high-voltage CMOS device to low-voltage CMOS device 10 typically requires yet another set of mask and implant steps. Accordingly, a circuit bearing low and high voltage CMOS devices typically requires three separate sets of mask and implant steps to form p-channel stops, low-voltage PMOS S/D regions and high-voltage PMOS S/D regions.

As a general rule, each mask step increases the complexity of the fabrication process and reduces yield due to the increased potential for processing defects. Increased complexity has a particularly detrimental effect on process yield in high density circuit arrays. Accordingly, it is desirable to eliminate process steps in general, and mask steps in particular, from the steps necessary to fabricate both low and high voltage CMOS devices.

SUMMARY OF THE INVENTION

The present invention provides a process that eliminates certain mask and implant steps typically used to form both low- and high-voltage CMOS devices. In accordance with the present invention, semiconductor-fabrication is made more efficient by implanting one or more stop(s) and a S/D region of one or more devices in a single step. The process may be used to produce low-voltage CMOS devices, high-voltage CMOS devices or both low- and high-voltage CMOS devices on the same substrate utilizing the same fabrication sequence. This invention may contribute to lower fabrication costs through the elimination of process steps and higher overall process yield through reduced device complexity.

In one embodiment, a process for fabricating a CMOS device includes the steps of growing a thick field oxide over a substrate and selectively implanting the substrate (through the thick field oxide) to form a stop region and a source/drain region in a single process step.

In another embodiment, a process for fabricating a semiconductor device includes the steps of growing a thick field oxide over a substrate; selectively implanting the substrate through the thick field oxide to form a plurality of stop regions, a first source/drain region and a second source/drain region in a first single process step; forming a first polysilicon gate over the first source/drain region; forming a second polysilicon gate over the second source/drain region; and doping the first and said second gates in a second single process step.

In yet another embodiment, a process for fabricating a semiconductor device includes the steps of forming a well of a first dopant type in a substrate, and selectively implanting the substrate and the well to form a stop region in the substrate and a first source/drain region in the well in a single process step, the stop region and the first source/drain region being of a second dopant type.

In another embodiment, a semiconductor device includes a stop region disposed in a substrate containing a first dopant type; a well disposed in the substrate implanted with a second dopant type; a first source/drain region disposed in the well, the first source/drain region containing the first dopant type; a thick field oxide disposed over the well; and a first gate structure disposed over the thick field oxide.

A further understanding of the nature and advantages of the invention may be realized by reference to the remaining portions of the specification and drawings.

BRIEF DESCRIPTION OF THE DRAWINGS

FIGS. 3–7 are diagrammatic sections of combined low- and high-voltage CMOS devices undergoing fabrication pursuant to the process illustrated in FIG. 2;

FIGS. 8A and 8B provide alternative cross-sectional diagrams of structures illustrated in FIGS. 6 and 7, respectively;

FIGS. 9A and 9B provide an alternative embodiment to the structure illustrated in FIGS. 3 and 4.

DETAILED DESCRIPTION OF A SPECIFIC EMBODIMENT

Figure 1:
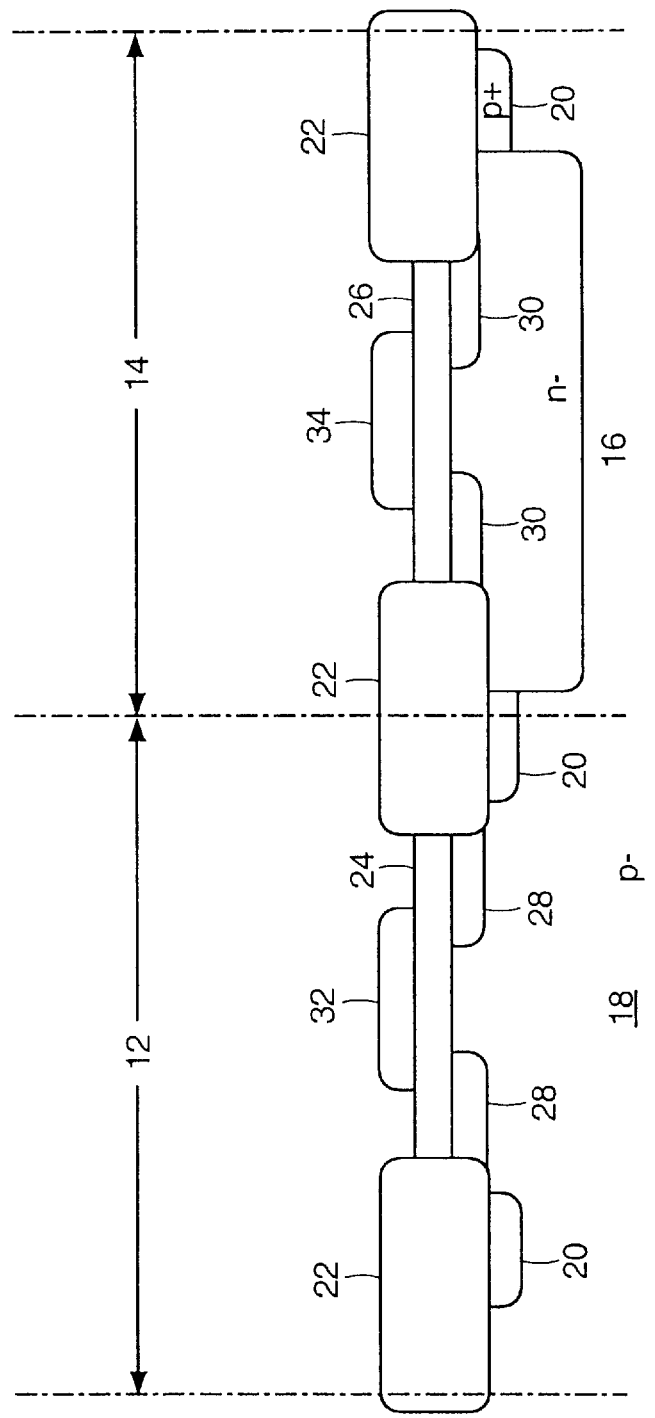
FIG. 1 is a diagrammatic section of a known, low-voltage CMOS device.
Figure 2:
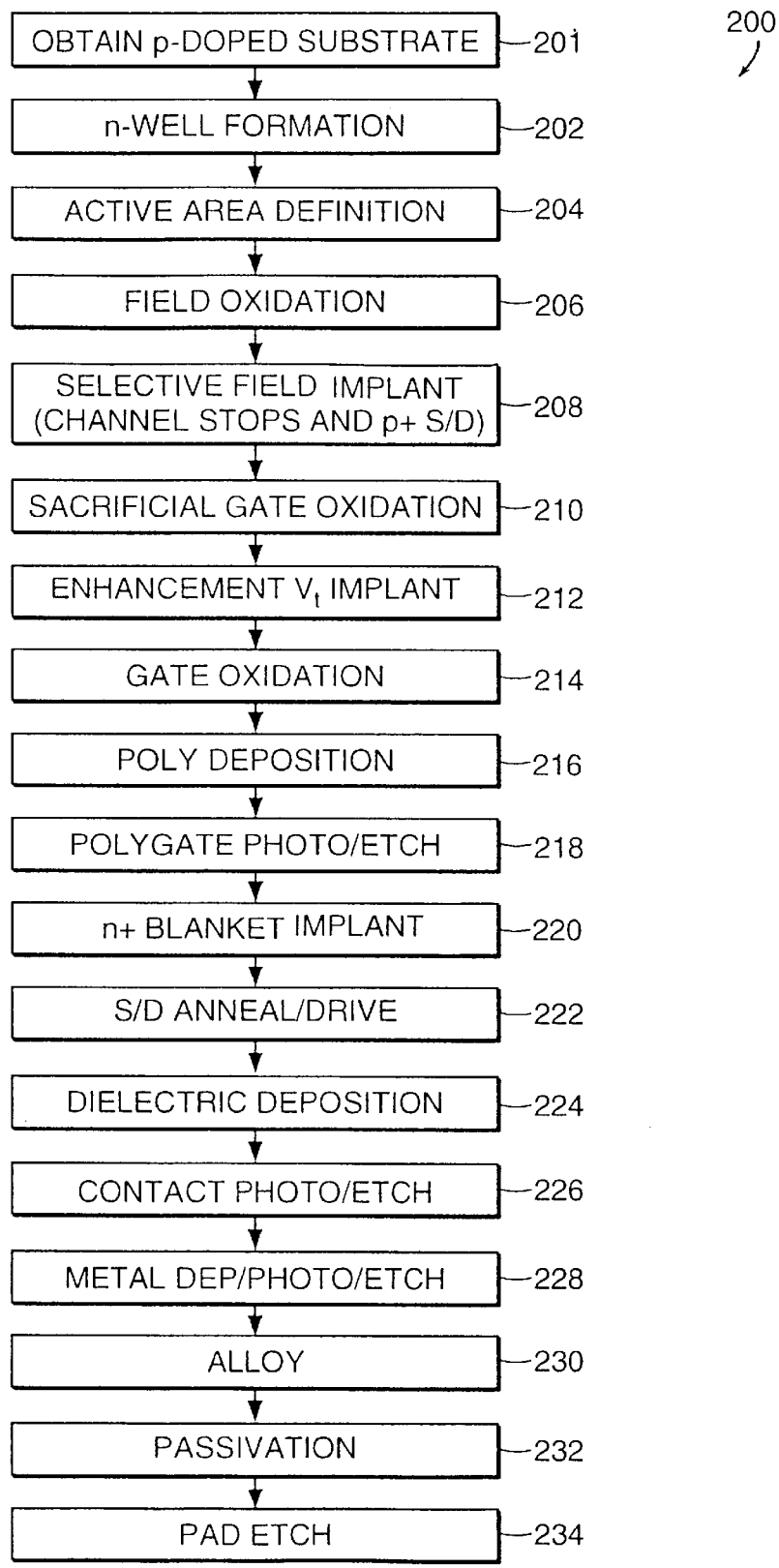
FIG. 2 is a flow chart of a process for fabricating low- and high-voltage CMOS circuits in accordance with the principles of the present invention.

FIG. 2 discloses a flow chart 200 of a CMOS fabrication process carried out according to the principles of the invention. In the following discussion, the process of flow chart 200 will be illustrated by the cross-sectional circuit drawings provided in FIGS. 3 to 7. The result of this process includes CMOS structure 800 of FIG. 7, which includes a low-voltage CMOS device 818 (i.e., low-voltage NMOS 812 and PMOS 810) and a high-voltage CMOS device 820 (i.e., high-voltage NMOS 814 and PMOS 816).

The following discussion describes those process steps and resulting structure necessary to understand the present invention. Conventional semiconductor-fabrication process steps, well known to those having ordinary skill in the art and routinely applied, are omitted from this discussion. A description of such conventional steps may be found in, e.g., S.Sze, VLSI Technology (Second Edition) McGraw-Hill (1988) and Stanley Wolf, *Silicon Processing for the VLSI Era, Vol. 2: Process Integration*, Lattice Press (1990), both of which are hereby incorporated by reference in their entirety for all purposes.

Referring to block 201 in FIG. 2, an initial step of this process is to obtain a p-doped substrate 302 (FIG. 3), which is doped to about $2\times10^{15}$ to $4\times10^{15}$ per $cm^3$ and is about 500 micrometers thick. Preferred substrate material and dopant are single crystalline silicon and boron, respectively. Next, n-wells and an n-tank are formed in substrate 302 pursuant to block 202. This operation is illustrated in FIG. 3 which shows p-doped substrate 302 holding n-wells 304, 306 and n-tank 308. The n-wells and n-tank shown in FIG. 3 may be formed simultaneously using one mask step and one selective implant step or, more preferably, may be formed through two sets of mask and implant steps.

Pursuant to the latter method, a conventional photoresist layer is formed over substrate 302 and developed to facilitate creation of n-wells 304, 306. These regions are then selectively implanted using, e.g., $8.0\times10^{12}$ per $cm^2$ of phosphorous ($P^{31}$) at 80 keV. Upon completing n-well implantation, the photoresist is stripped and the n-wells are driven in by applying heat to a level of about 1250° C. for about 480 minutes. The resulting n-wells are about 7 to 8 micrometers deep (preferably 8) from the surface 303 of substrate 302. (In an alternative embodiment, these n-wells may be about 5–6 micrometers deep.)

N-tank 308 is created in similar fashion. A conventional photoresist layer is formed over substrate 302 and developed to facilitate creation of n-tank 308. This region is then selectively implanted using, e.g., $6.0\times10^{12}$ per $cm^2$ of phosphorous ($P^{31}$) at 80 keV. Upon completing n-tank implantation, the photoresist is stripped and the n-tank is driven in by applying heat to a level of about 1142° C. for about 350 minutes. The resulting n-tank 308 is about 2 to 3 micrometers deep (preferably 2) from the surface 303 of substrate 302.

Prior to defining active areas (pursuant to block 204), substrate 302 undergoes an enhancement implant. Specifically, substrate 302 is covered with a thin thermal oxide (i.e., a "pad" oxide) about 350 angstroms thick. (This oxide is grown at a temperature of approximately 800° C. for about 105 minutes.) The substrate 302 is then blanket implanted through the pad oxide using, e.g., $2.0\times10^{11}$ per $cm^2$ of boron ($B^{11}$) at 80 KeV to raise the dopant concentration of the substrate. Alternatively, substrate 302 may have a higher dopant concentration at the outset (i.e., at block 201) and thereby eliminate the need for an enhancement step altogether.

Returning to FIG. 2, flow chart 200 next requires active area definition pursuant to block 204. This is performed through a conventional process of depositing a silicon nitride layer ($Si_3N_4$) over the pad oxide to a thickness of about 700 angstroms, depositing and patterning a conventional photoresist layer over the silicon nitride, etching the silicon nitride to thereby define active areas (i.e., where the silicon nitride remains unetched) and stripping the patterned photoresist from the silicon nitride. What remains is a mask of silicon nitride and pad oxide (a "nitride/pad mask") atop substrate 302 covering active areas. The nitride/pad mask is used in the field oxidation step of block 206 in FIG. 2.

Pursuant to block 206, field oxide is grown (at a temperature of approximately 957° C. for about 250 minutes) to yield an oxide thickness of about 5000 angstroms in those areas free of the nitride/pad mask. This mask is then stripped, leaving behind a conventional pattern of thick field oxide, as shown in FIG. 4. Referring to this figure, field oxide growth 402–408 is disposed atop and within substrate 302.

Figure 5:
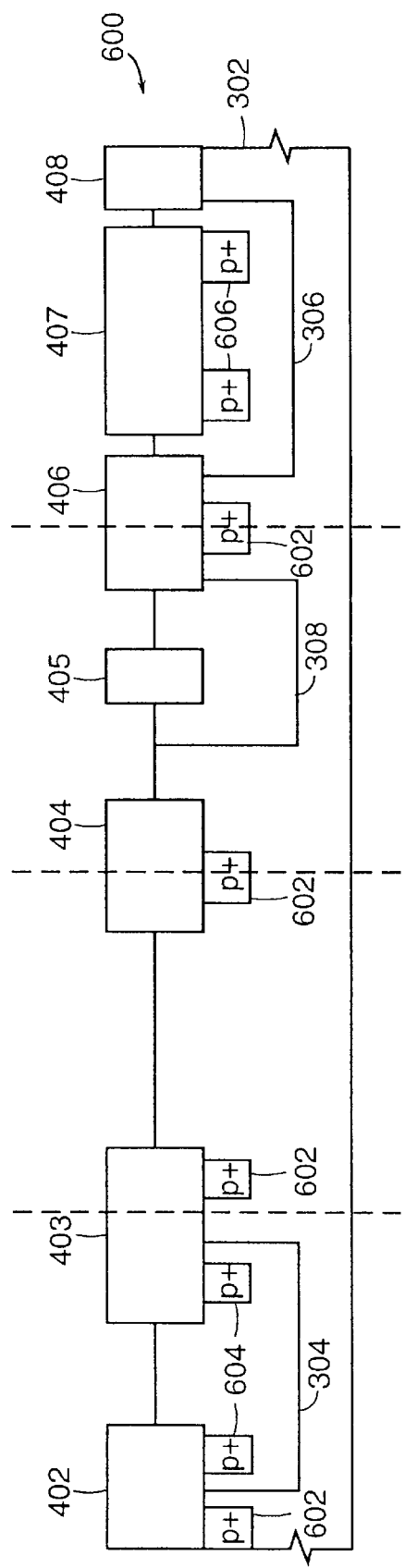

Returning to FIG. 2, flow chart 200 next requires a selective high energy field implant pursuant to block 208. In this operation, a conventional photoresist mask is formed over structure 400 (FIG. 4) and patterned to enable the simultaneous creation of p-channel stop regions and p+ S/D regions (for both low- and high-voltage CMOS devices) using a single high energy implant. More specifically, structure 400 is selectively implanted with boron ($B^{11}$) at, e.g., $3\times10^{11}$ per $cm^2$ at 180 keV to simultaneously create in a single step p-channel stop regions 602, S/D regions 604 (of low-voltage PMOS device 810) and S/D regions 606 (of high-voltage PMOS device 816), as shown in FIG. 5. Accordingly, using a high energy ion implant through thick field oxide 402–404 and 406–407 allows S/D regions of PMOS devices 810 and 816 to be created in the same process step as the p-channel stops. (Although FIG. 5 includes both low- and high-voltage CMOS devices in a single structure, this process, of course, may also be used to simultaneously create S/D regions and stop regions solely in low-voltage or high-voltage CMOS devices.)

As the foregoing illustrates, the p+ ion implant used for p-channel stops 602 and p+ S/D regions 604, 606 must have sufficiently high energy to penetrate thick field oxide 402–404 and 406–407. Further, the implant dose must be sufficient to provide ohmic contact to the substrate. This requires an implant dose of approximately $3\times10^{15}$ to $1\times10^{16}$ per $cm^2$ of p+ dopant (e.g., boron), or a doping concentration of at least about $1\times10^{19}$ per $cm^3$. Ideally, the surface concentration of the p+ dopant should be on the order of $1\times10^{19}$ per $cm^3$ to provide good ohmic contact.

As is well known, the edges of the implanted p-channel stops 602 must be sufficiently far from the S/D regions for both the PMOS and NMOS devices to provide adequate breakdown protection. The distance is determined by conventional device breakdown rules (for low-voltage and high-voltage devices) which are well known to those having ordinary skill in the art.

As shown in FIG. 2, flow chart 200 next requires sacrificial gate oxidation, pursuant to block 210. This oxide is grown at a temperature of approximately 800° C. for about 90 minutes to yield a thickness of about 350 angstroms over the surface of structure 600 (FIG. 5). This oxide remains in place for the duration of the enhancement $V_t$ implant operation (i.e., $V_t$ adjustment), pursuant to block 212.

Returning to FIG. 2, $V_t$ values for low voltage PMOS and low and high voltage NMOS devices are adjusted pursuant to block 212. More specifically, a blanket implant of boron ($B^{11}$) at, e.g., $2.5 \times 10^{11}$ per $cm^2$ at 35 keV is applied across the surface of structure 600 (FIG. 5), which includes a layer of sacrificial gate oxide (not shown). Thereafter, the sacrificial gate oxide is stripped. Adjustment of $V_t$ is a conventional process well known to those having ordinary skill in the art.

Upon completion of $V_t$ implant, a thin (i.e., about 650 angstroms) gate oxide is grown (at a temperature of approximately 957° C. for about 105 minutes) over the surface of structure 600 (FIG. 5) using conventional processes pursuant to block 214. Should thinner gate oxides be used (e.g., 350 or 250 angstroms), higher dosages of boron (e.g., $7.5 \times 10^{11}$ to $1 \times 10^{12}$ or $1 \times 10^{12}$ to $1.5 \times 10^{12}$ per $cm^2$, respectively) are required. In response to these variations in boron dosage, n-well surface concentration may require adjustment to maintain the same $V_t$ value for low-voltage PMOS device 810.

Polysilicon gate material is next deposited atop the gate oxide and thick field oxide (forming a layer about 4000 angstroms thick) pursuant to block 216 of FIG. 2. The polysilicon gate material is doped n-type (e.g., using phosphorous) by diffusion, implantation or in situ doping. Thereafter, the polysilicon layer is patterned pursuant to block 218 of FIG. 2 through a conventional sequence of depositing a layer of photoresist, developing the resist, etching the polysilicon and then stripping the resist. The resulting structure 700 is shown in FIG. 6, where thin gate oxide 702, thick oxide 407 (forming gate oxide for a high-voltage PMOS device) and polysilicon gate material 706, 708, 710 and 712 form gates for the low and high voltage CMOS devices.

Figure 7:
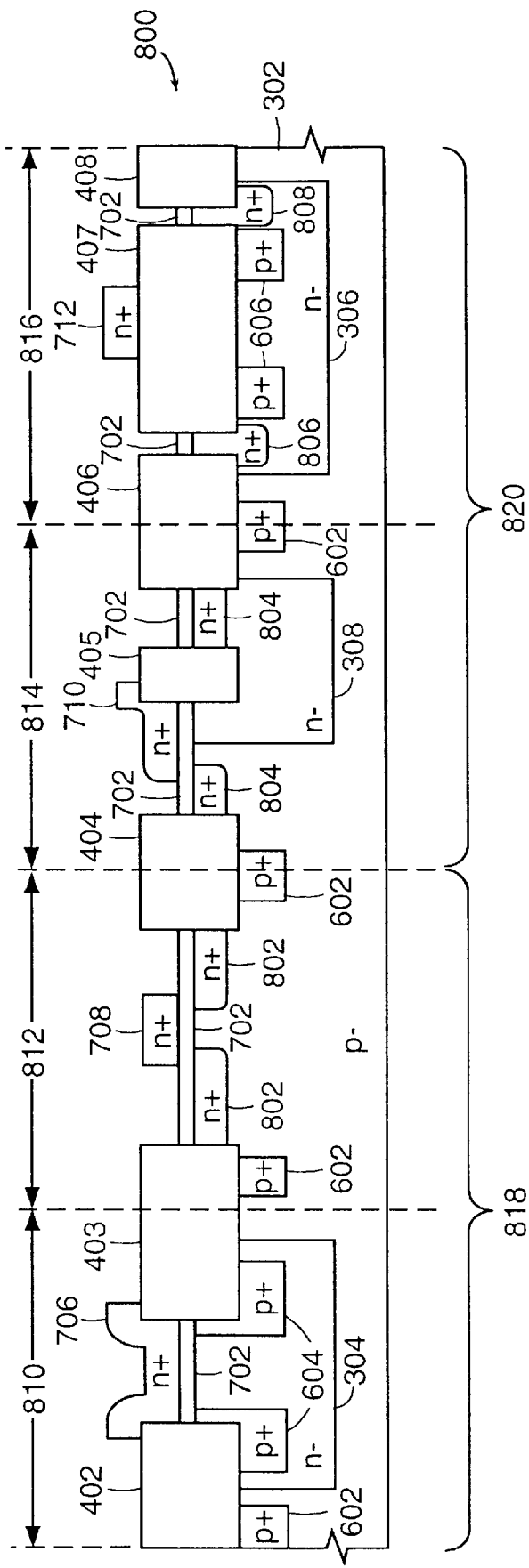

Referring back to FIG. 2, after the polysilicon is patterned, the surface of structure 700 is subject to an arsenic blanket implant, e.g., $8.5 \times 10^{15}$ per $cm^2$ at 80 keV, pursuant to block 220 (alternatively, phosphorous may be used). This implant creates S/D regions 802 of low-voltage NMOS device 812 and S/D regions 804 of high-voltage NMOS device 814 in substrate 302, as shown in FIG. 7. Additionally, this implant creates ohmic contact regions 806 and 808 within n-well 306, as shown in FIG. 7.

This S/D implant is self aligned to polysilicon 708, 710 by choosing an implant energy so the dopant is blocked from substrate 302 by thick field oxide 402–408 and polysilicon gates 706–710, but allowed to pass through exposed portions of gate oxide 702. Moreover, arsenic blanket implant pursuant to block 220 simultaneously dopes n+ polysilicon gates 706–712 for both the NMOS and PMOS devices. Accordingly, NMOS S/D 802, 804, ohmic contact regions 806, 808 and polysilicon gates 706–712 are simultaneously doped in the same blanket implant step.

Figure 6:
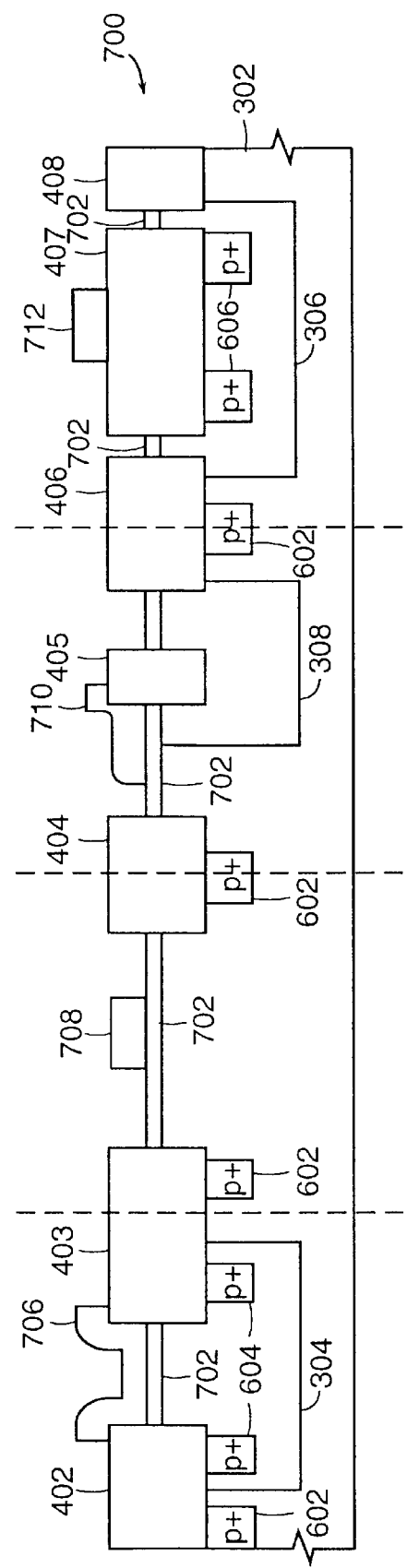

FIGS. 8A and 8B provide alternative cross-sectional diagrams of structures 700 and 800 illustrated in FIGS. 6 and 7, respectively. FIGS. 8A and 8B more accurately depict the physical shape of the various components that make up structures 700 and 800, with corresponding components identified with the same reference numbers.

After implantation, structure 800 is subject to an anneal/drive step pursuant to block 222 of FIG. 2. This diffuses the newly implanted dopant to a depth of about 0.5 micrometers by subjecting the structure to a temperature of approximately 957° C. for a period of about 30 minutes.

The anneal drive operation also affects the p+ S/D regions of PMOS devices 810 and 816. Initially, as shown diagrammatically in FIG. 6, the p+ S/D regions 604 and 606 are implanted some distance (approximately 0.2–0.4 micrometers; preferably 0.2–0.3 micrometers) from the edge of gates 706 and 712 (Note: FIGS. 3–8 are not drawn to scale). However, after S/D anneal/drive step in block 222, S/D regions 604 and 606 diffuse under the edge of gates 706 and 712, respectively, as shown in FIG. 7.

Structure 800 of FIG. 7 includes a low-voltage CMOS device 818 (i.e., low-voltage NMOS 812 and PMOS 810) and a high-voltage CMOS device 820 (i.e., high-voltage NMOS 814 and PMOS 816).

Referring again to FIG. 2, flow chart 200 next requires the formation of metal contacts to the CMOS devices of structure 800 in accordance with blocks 224–228. Specifically, pursuant to block 224, a dielectric layer (e.g., silicon dioxide) is deposited atop structure 800 to isolate a subsequent metal interconnect level from polysilicon 706–712. Contact windows are then etched into the dielectric layer (using a conventional photoresist mask) in to expose S/D regions or polysilicon wherever contacts are desired, pursuant to block 226. A metal layer is next deposited and patterned in accordance with conventional masking technology, pursuant to block 228.

Figure 10:
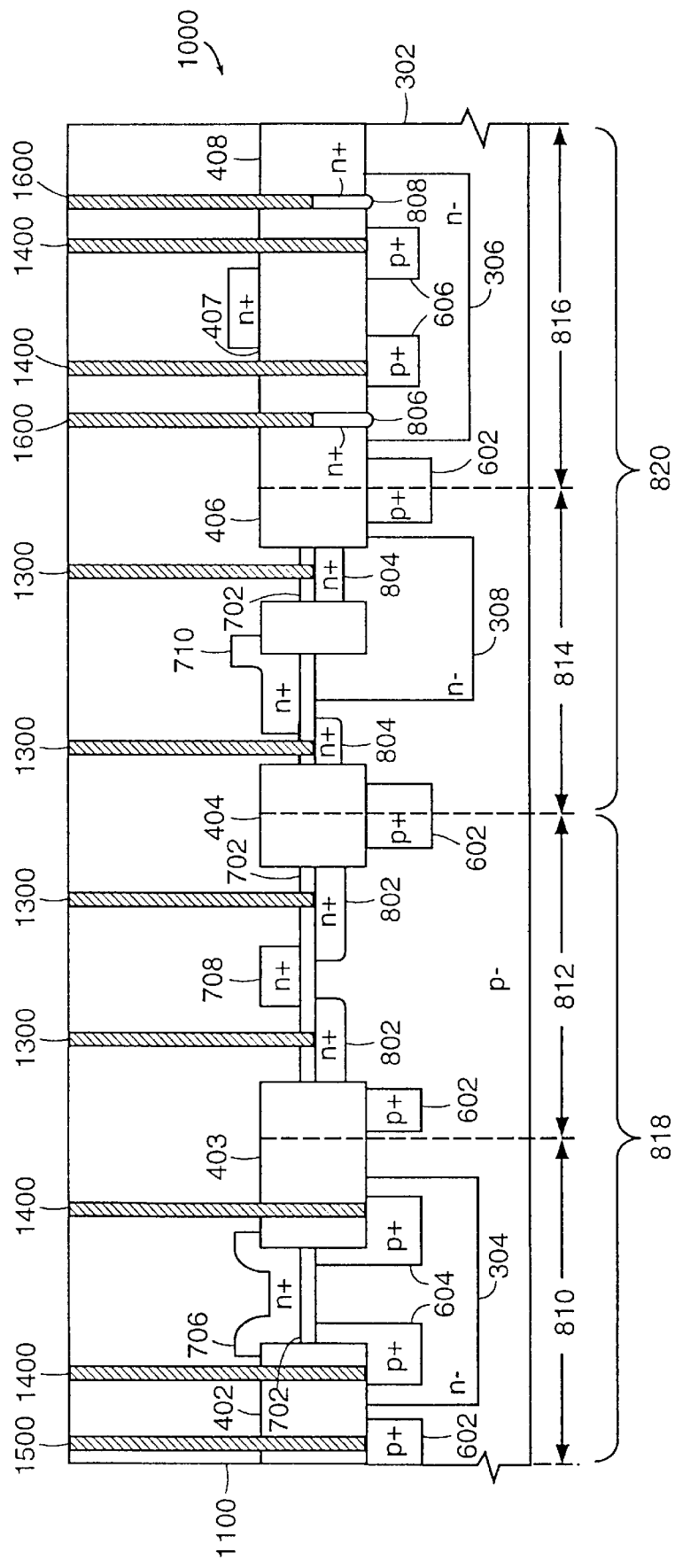
FIG. 10 is a cross-sectional view of CMOS devices in accordance with the present invention containing contact etch windows.

More specifically, structure 800 of FIG. 7 requires a unique window configuration to provide access to PMOS S/D regions 606 and 604. Referring to FIG. 10, structure 1000 is disclosed which includes a layer of silicon dioxide 1100 formed over structure 800 (from FIG. 7), pursuant to block 224 of FIG. 2. Significantly, standard contact etch windows 25 1300 for NMOS devices 812, 814 (passing through silicon dioxide layer 1100 and gate oxide 702) are formed concurrently with contact etch windows 1400 for PMOS devices 810, 816. As shown in FIG. 10, etch windows 1400 pass through silicon dioxide layer 1100 and field oxide growth 402, 403 and 407 thereby achieving contact with S/D regions 604 and 606.

This same etching process is used to create contact etch window 1500 (enabling contact to substrate 302 through p+ stop 602) and windows 1600 (enabling contact to n-well 306 through n+ ohmic contact regions 806, 808). Etch window 1500 passes through silicon dioxide layer 1100 and field oxide growth 402. Windows 1600 pass through silicon dioxide layer 1100 (disposed over and between oxide 406–407 and 407–408) and gate oxide 702.

Any standard contact etch process (e.g., plasma dry etch) may form these windows. Preferably, the source gas used has a high selectivity of silicon dioxide to silicon (e.g., a mixture of $CF_4$ and $CHF_3$). For larger geometries, a wet etch process may be used.

Any standard metallization process may be used to plug contact etch windows 1300–1600.

Referring again to FIG. 10, contact etch windows that provide access to n-well 304 in PMOS 810 could be formed using the same process described above to form contact etch windows 1600 in PMOS 816. In accordance with the foregoing discussion, such windows would require a patterning of thick field oxide 402, 403 (using the nitride/pad mask mentioned above) to accommodate formation of n+ ohmic contact regions in n-well 304. Thereafter, processing would be the same as described above with respect to n+ ohmic contact regions 806, 808 and etch windows 1600. (Note:

FIGS. 3–10 are not drawn to scale.) The result would be two additional etch contact windows passing through silicon layer 1100, one each passing through thick oxide 402 and 403, and both contacting n-well 304 through an n+ ohmic contact.

The remaining operations identified in FIG. 2 are conventional for NMOS or CMOS device fabrication. Pursuant to block 230, the resulting structure from block 228 is annealed in $H_2$ gas at approximately 400° C. for about 0.5 hours.

Next, two passivation layers are formed over the subject CMOS devices. A layer of silicon dioxide (approximately 3000 angstroms thick) and a capping layer of silicon nitride (approximately 6000 angstroms thick) are so formed to protect the devices from scratching or contamination, pursuant to block 232. Windows are then etched in these dual passivation layers (in accordance with conventional masking techniques) to create bond pads for external wire connections, pursuant to block 234.

In an alternative embodiment, field oxide is grown pursuant to block 206 of FIG. 2 resulting in the configuration of FIG. 9A. To facilitate placement of a gate for low-voltage PMOS device 810, field oxide growth 402' is etched (through the use of a conventional photoresist mask) to produce gap 902, as shown in FIG. 9B. The remaining operations shown in FIG. 2 (i.e., blocks 208–234) are then carried out in the same manner as described above in connection with FIGS. 3–7 to create low and high voltage CMOS devices from structure 900.

It is to be understood that the above description is intended to be illustrative and not restrictive. Many variations to the above-described method and apparatus will be readily apparent to those of skill in the art. For example, this process applies equally to other types of CMOS devices such as BiCMOS (twin tub or twin well) and p-well CMOS (n-substrate). More specifically, one having ordinary skill in the art would recognize the process disclosed herein, if used with an n-substrate, would require implanting n-type dopants through the thick field oxide to form n-channel stops and n+ S/D regions. The range for n-type dopants in silicon dioxide is much less than for p-type dopants indicating that the process would require higher implant energies. The scope of the invention should, therefore, be determined not with reference to the above description but, instead, should be determined with reference to the appended claims, along with their full scope of equivalence.

What is claimed is:

1. A semiconducting structure comprising:
   a substrate;
   a gate oxide extending from a first end to a second end, the gate oxide being disposed on the substrate
   a first thick field oxide extending from the first end of the gate oxide away from the gate oxide;
   a second thick field oxide extending from the second end of the gate oxide away from the gate oxide;
   a first p+ doped region disposed under the first thick field oxide;
   a second p+ doped region disposed under the second thick field oxide;
   a first gate disposed over the gate oxide, a first portion of the first gate extending over a portion of the first thick field oxide and a second portion of the first gate extending over a portion of the second thick field oxide.

2. A semiconducting structure according to claim 1, a first portion of the first p+ doped region being disposed under the first thick field oxide, a second portion of the first p+ doped region being disposed under a portion of the gate oxide.

3. A semiconducting structure according to claim 2, a first portion of the second p+ doped region being disposed under the second thick field oxide, a second portion of the second p+ doped region being disposed under a portion of the gate oxide.

4. A semiconducting structure according to claim 3, a concentration of p+ dopants in the first portion of the first p+ doped region being greater than in the second portion of the first p+ doped region, and a concentration of p+ dopants in the first portion of the second p+ doped region being greater than in the second portion of the second p+ doped region.

5. A semiconducting structure according to claim 1, further comprising an n-well, the first and second p+ doped regions being disposed in the n-well.

6. A semiconducting structure according to claim 5, further including a stop region.

7. A semiconducting structure according to claim 6, wherein the first and second p+ doped regions and the stop region are formed by simultaneously implanting dopants through the first and second thick field oxides into the substrate.

8. A semiconducting structure according to claim 1, further including an nmos transistor comprising:
   an active region;
   a second gate disposed over at least a portion of the active region;
   an n+ doped source region disposed in the substrate under the active region;
   an n+ doped drain region disposed in the substrate under the active region.

9. A semiconducting structure according to claim 8, wherein the n+ doped source region, the n+ doped drain region, the first gate, and the second gate are formed by simultaneously implanting n+ type dopants into the device.

10. A semiconducting structure according to claim 1, further including an nmos transistor comprising:
    a third thick field oxide;
    a second gate oxide disposed on the substrate on one side of the third thick field oxide;
    a third gate oxide disposed on the substrate on a side of the third thick field oxide opposite the one side;
    an n+ doped source region disposed in the substrate under the second gate oxide;
    an n+ doped drain region disposed in the substrate under the third gate oxide;
    an n+ doped gate, a portion of the n+ doped gate being disposed over the second gate oxide and a portion of the n+ doped gate being disposed over the third thick field oxide.

11. A semiconducting structure according to claim 10, further including an n- tank disposed in the substrate, the n+ doped drain region being disposed in the n- tank.

12. A semiconducting structure according to claim 11, further including a stop region disposed between the first gate and the nmos transistor.

13. A semiconducting structure according to claim 12, wherein the first and second p+ doped regions and the stop region are fabricated by simultaneously implanting dopants into the structure.

14. A semiconducting structure according to claim 13, further including a pmos transistor including:
    a fourth thick field oxide;
    a p+ doped source region disposed under the fourth thick field oxide;
    a p+ doped drain region disposed under the fourth thick field oxide;
    a second gate disposed over the fourth thick field oxide.

* * * * *